United States Patent
Wynn

[11] Patent Number: 5,913,154
[45] Date of Patent: Jun. 15, 1999

[54] VSWR CONTROL TECHNIQUE FOR TERMINAL PRODUCTS WITH LINEAR MODULATION

[75] Inventor: Stephen R. Wynn, Lynchburg, Va.

[73] Assignee: Ericsson, Inc., Research Triangle Park, N.C.

[21] Appl. No.: 08/839,810

[22] Filed: Apr. 18, 1997

[51] Int. Cl.$^6$ ............................. H01Q 11/12; H04B 1/06
[52] U.S. Cl. ................. 455/127; 455/126; 455/235.1; 455/250.1; 330/127; 330/207 P
[58] Field of Search ................................ 455/127, 126, 455/232.1, 235.1, 249.1, 250.1, 115, 117, 77, 87; 330/127, 129, 151, 207 P, 298; 375/345

[56] References Cited

U.S. PATENT DOCUMENTS

| | | | |
|---|---|---|---|
| 4,165,493 | 8/1979 | Harrington | 330/207 P |
| 4,353,037 | 10/1982 | Miller | 330/298 |
| 4,380,767 | 4/1983 | Goldstein et al. | 455/123 |
| 4,422,047 | 12/1983 | Wright | 455/115 |
| 4,457,811 | 7/1984 | Lemson | 455/235.1 |
| 5,287,555 | 2/1994 | Wilson et al. | 455/127 |
| 5,564,086 | 10/1996 | Cygan et al. | 455/126 |
| 5,808,512 | 9/1998 | Bainvoll et al. | 455/126 |

FOREIGN PATENT DOCUMENTS

| | | |
|---|---|---|
| 456 921 | 11/1991 | European Pat. Off. . |
| 665 641 | 8/1995 | European Pat. Off. . |
| WO 93 18602 | 9/1993 | WIPO . |

*Primary Examiner*—Dwayne D. Bost
*Assistant Examiner*—Tracy M. Legree
*Attorney, Agent, or Firm*—Nixon & Vanderhye P.C.

[57] ABSTRACT

A method for improving linear modulation compensation at the antenna terminals of an RF device in order to react to high voltage standing wave ratio variations is disclosed. In the present RF transmitters, such as portable radios, when transmission voltage standing wave ratio varies such that the linearization of its modulation technique is adversely affected, the dynamic accommodation of the variations in voltage standing wave ratio can be imposed on the output of the RF power amplifier to ensure that linearization is not lost. Specifically, the reverse power signal from the power amplifier can be detected and used to calculate a standing wave control signal. The standing wave control signal is provided to a step attenuator which attenuates the output of the power amplifier in an amount commensurate with the amount of reverse power signal at the output of the power amplifier. By adding attenuation in response to increases in reverse power signal, the linearity of the modulation being used can be controlled.

18 Claims, 4 Drawing Sheets

VSWR CONTROL TECHNIQUE FOR TERMINAL PRODUCTS WITH LINEAR MODULATION

FIELD OF THE INVENTION

The present invention relates to telecommunications, and more particularly to standing wave feedback control in transmitter and receiver circuitry.

BACKGROUND OF THE INVENTION

Transceivers are tuned to an output impedance that is designed to match the antenna to which the transceiver is operating. Traditionally, in the telecommunications environment, that output impedance is 50 ohms. If the output impedance of the transceiver and the input impedance of the antenna perfectly match, the output power from the transceiver will be fully carried to the antenna. On the other hand, if, as is more usually the case, the output impedance of the transceiver is not perfectly matched to the antenna, a portion of the output power is reflected back into the transceiver, rather than being carried to the antenna for transmission.

The reflection of power due to an imbalance between the transceiver load and the antenna is measured by a so-called voltage standing wave ratio. In quantitative terms, the voltage standing wave ratio for a transceiver at any given point in time is equal to the reflected power from the antenna divided by the output power from the transceiver. As shown in FIG. 1, for example, the transmitter/receiver 10 has a characteristic output impedance of 50 hms. In an ideal scenario, the impedance $Z_o$ of the antenna 12 would also exhibit the same 50 ohm characteristic at its input, thus matching the impedance of the transceiver. When this match situation occurs, the reflected power $E_r$ is zero and the voltage standing wave ratio ($E_r/E_f$) is zero as well, meaning that all of the transmitter power is delivered to the antenna for transmission.

But, when the antenna impedance varies, the impedance match condition vanishes and some of the transmitted power is reflected back to the transmitter. In other words, as the antenna impedance $Z_o$ moves from 50 ohms, the reflected power $E_r$ is greater than zero, and the voltage standing wave ratio is greater than zero. These changes in the antenna impedance $Z_o$ occur, for example, when people or other objects move nearer to or farther from the antenna 12, thus changing the antenna load characteristics. Such changes in the antenna load are quite common in mobile radio transmitters, which travel in and out of scenes that may put them closer to or farther from different types of human and non-human objects.

In fact, some mobile radio transceivers can exhibit dramatic swings in their instantaneous voltage standing wave ratio, caused mainly due to the presence (or lack of presence) of human and non-human objects in the vicinity of the transceiver antenna. The power amplifier in the transceiver is particularly sensitive to such swings, and thus must be designed to accommodate them. A problem exists, however, when high variation in the voltage standing wave ratio disturbs the linear operation of the power amplifier. In such a situation, cartesian feedback can be employed to try to maintain that linear operation, but even then, wide swings in voltage standing wave ratio can adversely effect the transceiver operation.

Portable transceivers have, in the past, tried to contend with the detuning that occurs at the antenna when the transceiver approaches and retreats from objects. Ordinarily, the solution has been to design power amplifiers in the transceiver to withstand a worst-case scenario. Sometimes, for example, where no amplitude variation in the RF carrier exists, the problem can be solved by designing a stable RF power amplifier at around 8:1 voltage standing wave ratio. But, most modern modulation techniques involve amplitude variation in the RF carrier (such as DQ Phase Shift Key Modulation, for example), which can cause the voltage standing wave variations to adversely affect the quality of the transmitted signal, even when the amplifier is designed at the 8:1 ratio. These problems are then made even worse when class AB or class C amplifiers are employed.

A Cartesian feedback linearization technique, discussed above, can settle some of the adverse quality problems associated with voltage standing wave variation. But, the effects of variation in voltage standing wave ratios can cause the Cartesian feedback loop to stretch beyond its ability to compensate. Indeed, maintaining stability in the cartesian feedback loop is vital to its good operation, and wide swings in voltage standing wave ratio can cause this loop to lapse into instability. Further complicating this problem is the difficulty that exists in detecting (and thus preventing) large numbers of production line products that may ultimately exhibit this instability problem.

Prior devices have attempted to ameliorate this problem using a variety of unsatisfactory techniques. For example, prior devices have employed an RF isolator (typically ferrite) ahead of the antenna to shield the power amplifier in the transceiver from any antenna load variation. Unfortunately, isolators are costly, operate in a narrow band, and are large (especially when employed at 150 MHz or higher).

Other prior devices have placed a fixed load between the power amplifier and the antenna in order to limit the voltage standing wave ratio. This technique effectively controls voltage reflection, but does so at a cost of output power. In fact, a fixed load will drain output power even when the antenna load perfectly matches the transceiver output load, i.e., when the reflected power is zero and no voltage standing wave ratio control is even needed.

A still further method employed by prior devices involves controlling the impedance of the antenna dynamically. In these devices, a tunable matching circuit between the antenna load and the output of the amplifier adjusts the load seen by the transceiver to the approximate 50 ohm level anytime the antenna load is dramatically altered by its surroundings. This re-matching technique can be effective, but it is a complicated method involving impedance detectors at the antenna and matching circuits that must be easily tunable in high voltage conditions like those exhibited at the output of the RF power amplifier.

SUMMARY OF THE INVENTION

The present invention provides a simple and cost-effective solution to the problem of maintaining proper linear modulation performance during large fluctuations in antenna load. In it, wide voltage standing wave ratio swings are compensated by dynamically altering the impedance at the output of the power amplifier as the detected voltage standing wave ratio increases or decreases.

This is accomplished by first detecting the reverse power at the output of the power amplifier from the same coupler that provides the forward power signal to the cartesian feedback loop. From the reverse power signal, the voltage standing wave ratio is detected. A control signal identifying the voltage standing wave ratio is then produced and sent to an attenuator at the output of the power amplifier.

As the voltage standing wave ratio increases, attenuation is applied to the output of the power amplifier to compensate for the associated impedance imbalance. Although the cost of this attenuation is a reduction in output power, the radiated power (as evidenced by the high voltage standing wave ratio) would already be reducing power and thus a slight further attenuation is worth giving up for an assurance that the stability of the linear modulation techniques will not be impeded by the high power reflection.

Of course, the type of attenuation, the type of modulation, and the type of voltage standing wave ratio detection can all depart from the specifically stated embodiments and still be within the contemplation of the present invention.

BRIEF DESCRIPTION OF THE DRAWINGS

These, as well as other objects and advantages of this invention, will be more completely understood and appreciated by careful study of the following more detailed description of a presently preferred exemplary embodiment of the invention taken in conjunction with the accompanying drawings, of which.

DETAILED DESCRIPTION OF THE PRESENTLY PREFERRED EMBODIMENT

Figure 1:
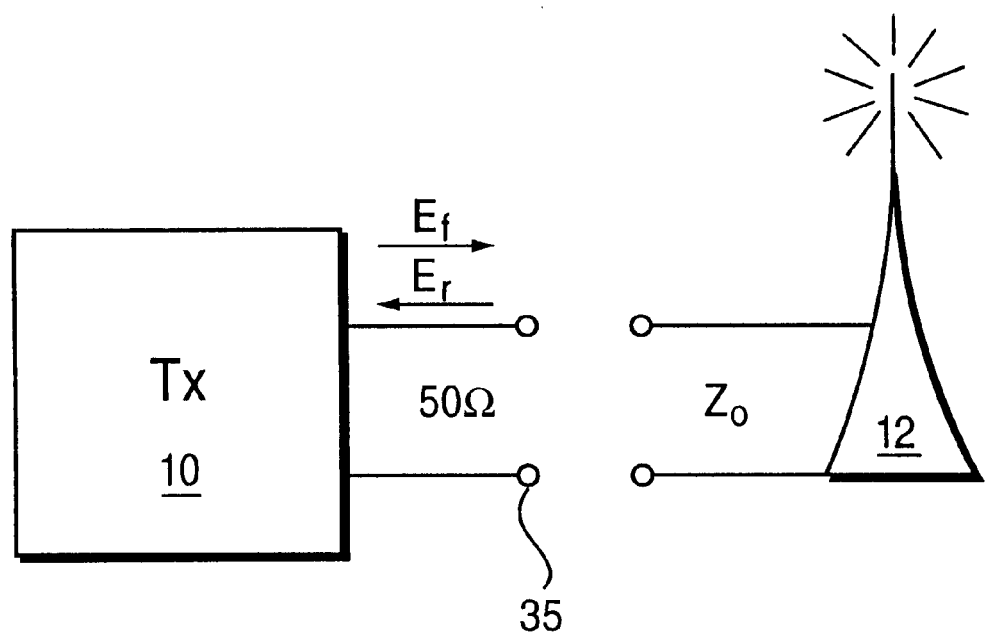
FIG. 1 is a schematic drawing of the transmitter and antenna of the present invention.

As shown in FIG. 1, the transceiver 10 according to one example embodiment of the present invention connects to an antenna 12 for purposes of transmitting and receiving RF signals. The connection between the transceiver 10 and the antenna 12 is a terminal 35, at which the transceiver output impedance (of, for example, 50 Ω) is exhibited. The antenna 12 connects to the terminal 35 to be in electrical communication with the components of the transceiver 10. The antenna 12 exhibits an impedance $Z_0$, which ideally is matched to the 50 Ω impedance of the transceiver 10.

When the antenna impedance $Z_0$ does not match the transceiver output impedance (50 Ω), the antenna 12 is said to be in an unmatched condition with the transceiver 10. In such a case, the output power from the transceiver 10 is not filly provided to the antenna 12 for transmission. Rather, some of the power output by the transceiver 10 is reflected back to the transceiver, as described in detail above.

The output power from the transceiver 10 is shown in FIG. 1 as $E_f$, referring to the forward power from the transceiver 10. When the impedance of the antenna 12 and the transceiver 10 do not match, a reflected power, $E_r$, will also be exhibited. The degree to which the impedance of the antenna 12 and the transceiver 10 fail to match can be shown by a so-called voltage standing wave ratio, which is equal to:

$$VSWR = \frac{E_r}{E_f}$$

As described in the background above, when the voltage standing wave ratio varies dramatically, due to changes in the impedance of the antenna 12, the operational characteristics of the transceiver 10 can be adversely affected.

Figure 2:
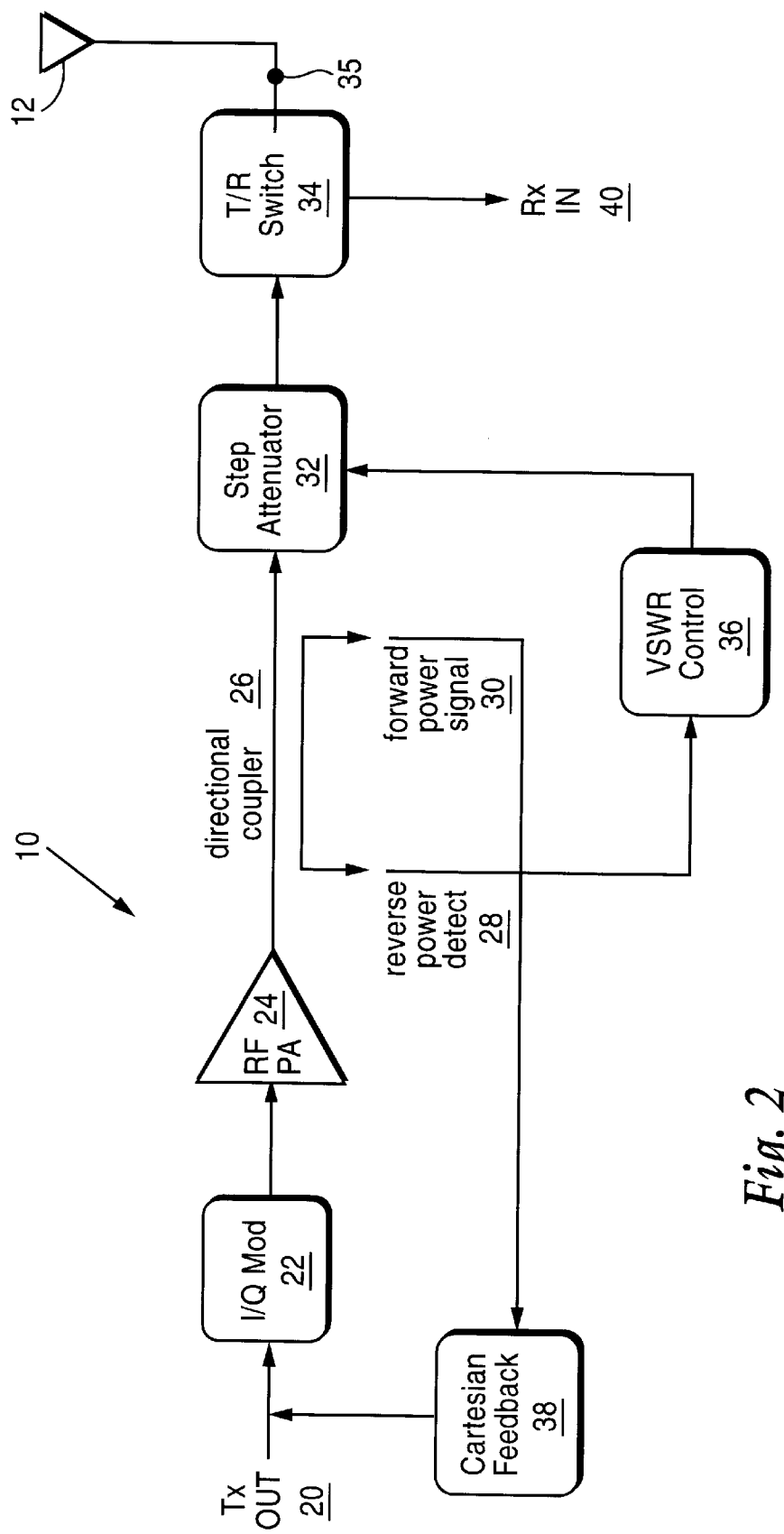
FIG. 2 is a schematic diagram of one example embodiment of the transceiver according to the present invention.

The present invention, of which one example embodiment is shown in FIG. 2, remedies these adverse affects. Like FIG. 1, the embodiment of FIG. 2 includes a transceiver 10 connected to an antenna 12 via a terminal 35. At the terminal 35, the transceiver 10 includes a transmission/reception switch 34, which selects either a transmission mode or a reception mode for the transceiver 10. In the transmission mode, the transceiver 10 transmits the transmission output 20 (after processing discussed below) via the antenna 12. In the reception mode, the antenna 12 receives the reception input signal 40. Other circuitry for processing the reception input 40 or for creating the transmission output 20 signals is not critical to the present invention.

In the transmission mode, the transmission signal 20 is input to a modulator 22. The output of the modulator 22 is input to an RF power amplifier 24, which in turn connects to a directional coupler 26. The directional coupler 26 detects the forward power signal 30 and the reverse power signal 28 at the output of the RF power amplifier 24. The signals correspond, for example, to $E_f$ and $E_r$ of FIG. 1, respectively. The forward power signal 30 is fed through Cartesian feedback loop 38 to the input of the modulator 22. In the example of FIG. 2, the modulator 22 is a linear operation modulator and the Cartesian feedback loop 38 is designed to maintain that linear operation.

Meanwhile, the reverse power signal 28 from the directional coupler 26 is input to a voltage standing wave ratio controller 36. The voltage standing wave ratio controller 36 outputs a standing wave control signal to a step attenuator 32. The step attenuator 32 thus receives both the output from the RF power amplifier 24 via the directional coupler 26, as well as the standing wave control signal from the voltage standing wave ratio controller 36. An example embodiment of the step attenuator 32 is shown and described with respect to FIG. 3, below. The output of the step attenuator 32 is provided to the transmission/reception switch 34, and ultimately to the antenna 12 via the terminal 35.

In operation, the transmission signal is modulated in the modulator 22 via some form of linear modulation, for example, DQ phase shift key modulation. The modulated signal from the modulator 22 is amplified in the RF power amplifier 24 and then output to the step attenuator 32 via the directional coupler 26.

The directional coupler 26 senses the forward power and the reverse power (i.e., the reflected power caused by any mismatched conditions at the terminal 35). The directional coupler 26 then provides the reverse power signal 28 to the voltage standing wave ratio controller 36. Since the reverse power signal 28 is an indication of the reflected power, and hence an indication of the mismatch condition at terminal 35, the voltage standing wave ratio controller 36 accepts the reverse power signal as an indication of the instantaneous voltage standing wave ratio at terminal 35. Using the reverse power signal 28, the voltage standing wave ratio controller 36 thus provides the step attenuator 32 with a standing wave control signal indicating the degree to which the reverse power signal 28 is present at the directional coupler 26, i.e., at the output of the RF power amplifier 24.

The step attenuator 32, which has received the output of the RF power amplifier 24 via the directional coupler 26 then uses the standing wave control signal to choose an appropriate attenuation to be applied to the output of the RF power amplifier 24. A step attenuation is possible, for example, that places perhaps one DB attenuation per step to the output signal of the RF power amplifier 24. The steps of attenuation are added or subtracted from the output of the RF power amplifier 24 based on the standing wave control signal from the voltage standing wave ratio controller 36, which in turn is an indication of the reverse (or reflected) power signal 28.

The amount of attenuation provided by the step attenuator 32 is thus related to the amount of reflected power provided at the output of the RF power amplifier 24. The step attenuator 32 thus provides more attenuation as the voltage standing wave ratio increases (i.e., as reflected power increases), up to a maximum attenuation parameter. The maximum should represent a margin of safety that provides good linearization, compensation and loop stability.

The attenuation provided by the step attenuator 32 at the output of the RF power amplifier 24 ensures that the linearity of the modulator 22 is maintained and the stability of the Cartesian feedback loop 38 is not comprised by high fluctuations in the voltage standing wave ratio of the transceiver 10. Because the step attenuator 32 is stepped in nature, the output power from the step attenuator 32 can be maximized for a given voltage standing wave ratio. That is, the output power of the transceiver 10 can remain strong while ensuring compensation for the linear characteristic of the modulator 22, without attenuating more than what is necessary to provide good linearization and the stability.

Figure 3:
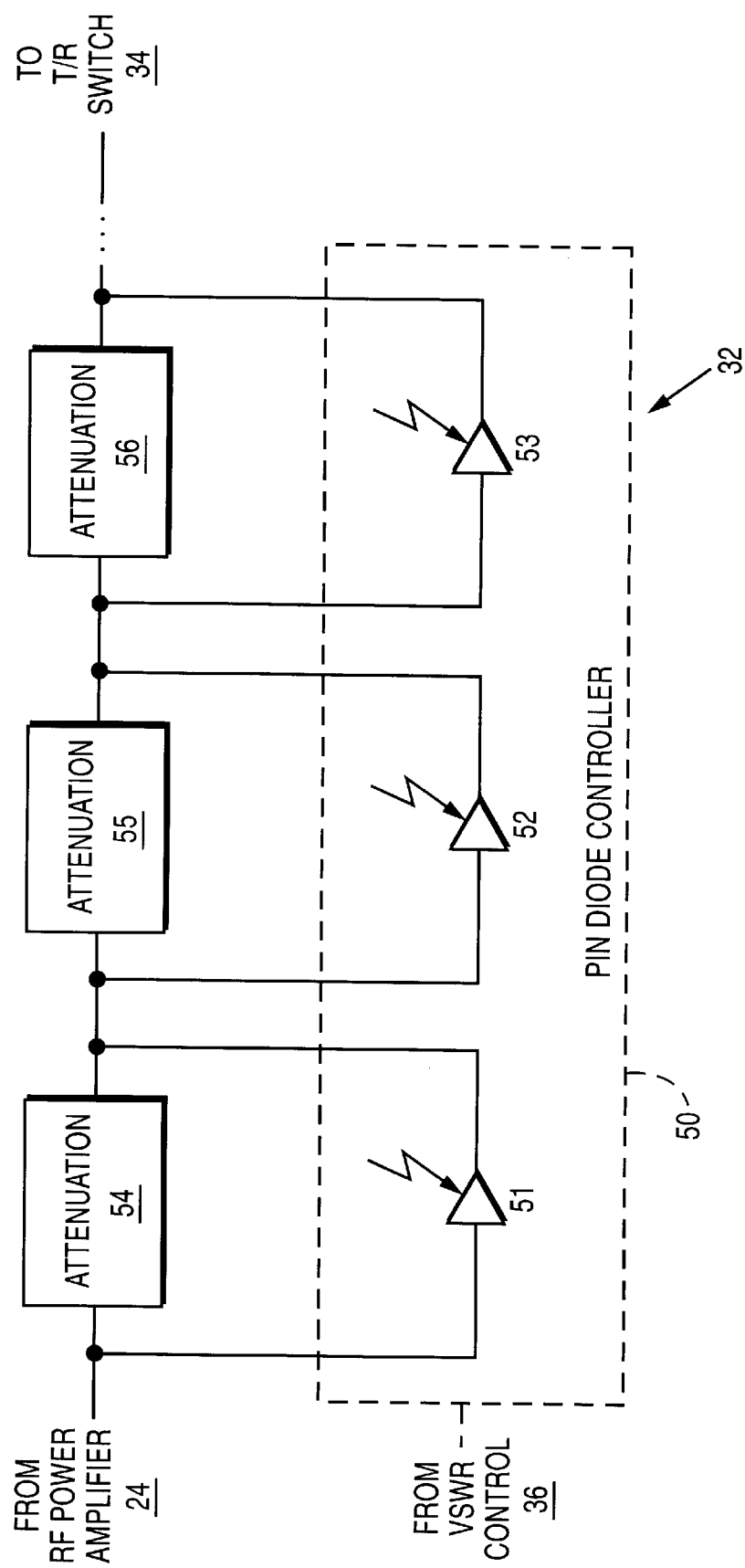
FIG. 3 is a schematic diagram of an example step antennuator from the transceiver of FIG. 2.

One example embodiment of the step attenuator 32 according to the present invention is shown in FIG. 3. In FIG. 3, as an example, three separate attenuators 54–56 are provided respectively in parallel with corresponding PIN diodes 51–53. The diodes 51–53 are controlled via a PIN diode controller 50 which receives the standing wave control signal from the voltage standing wave ratio controller 36. Depending upon the control signal provided to the PIN diode controller 50, one or more of the PIN diodes 51–53 will be activated so as to place one or more of the corresponding loads 54–56 on the output from the RF power amplifier 24. The loads 54–56 which are selected by activation of the corresponding PIN diodes 51–53 thus attenuate the output of the RF power amplifier 24 by an appropriate amount based on the amount of reverse power signal 28 (FIG. 2) provided to the voltage standing wave ratio controller 36 via the directional coupler 26.

The method of attenuation can vary from that shown in FIG. 3, but the PIN diodes in a resistive attenuator structure is a preferred embodiment. The PIN diodes are typically used in Rx/Tx switches because they are able to handle high power levels with low loss. Thus, the attenuator may be incorporated into the Rx/Tx switch 34, rather than being a separate component step attenuator 32, as shown in FIG. 2. Further, the PIN diode controller 50 can be a separate hardware component, or may be employed in software as part of the linearization function. The speed of the attenuator 32 is not particularly critical since a voltage standing wave ratio will change only slowly. Thus, compensation for changes in the ratio can change slowly as well.

The number of loads 54–56 can vary from one to any number, with more loads providing more attenuation control but also more complexity. The values of each attenuator 54–56 can be selected in known fashion based on the overall system parameters. The attenuators can be discrete resistors, resistor strip line or resistive coax. They may take the form of "T," "π," "Δ," or any other circuit formation. The PIN diodes 51–53 can be single or multiple diodes. They should be used with appropriate circuitry to insure their isolation.

Figure 4:
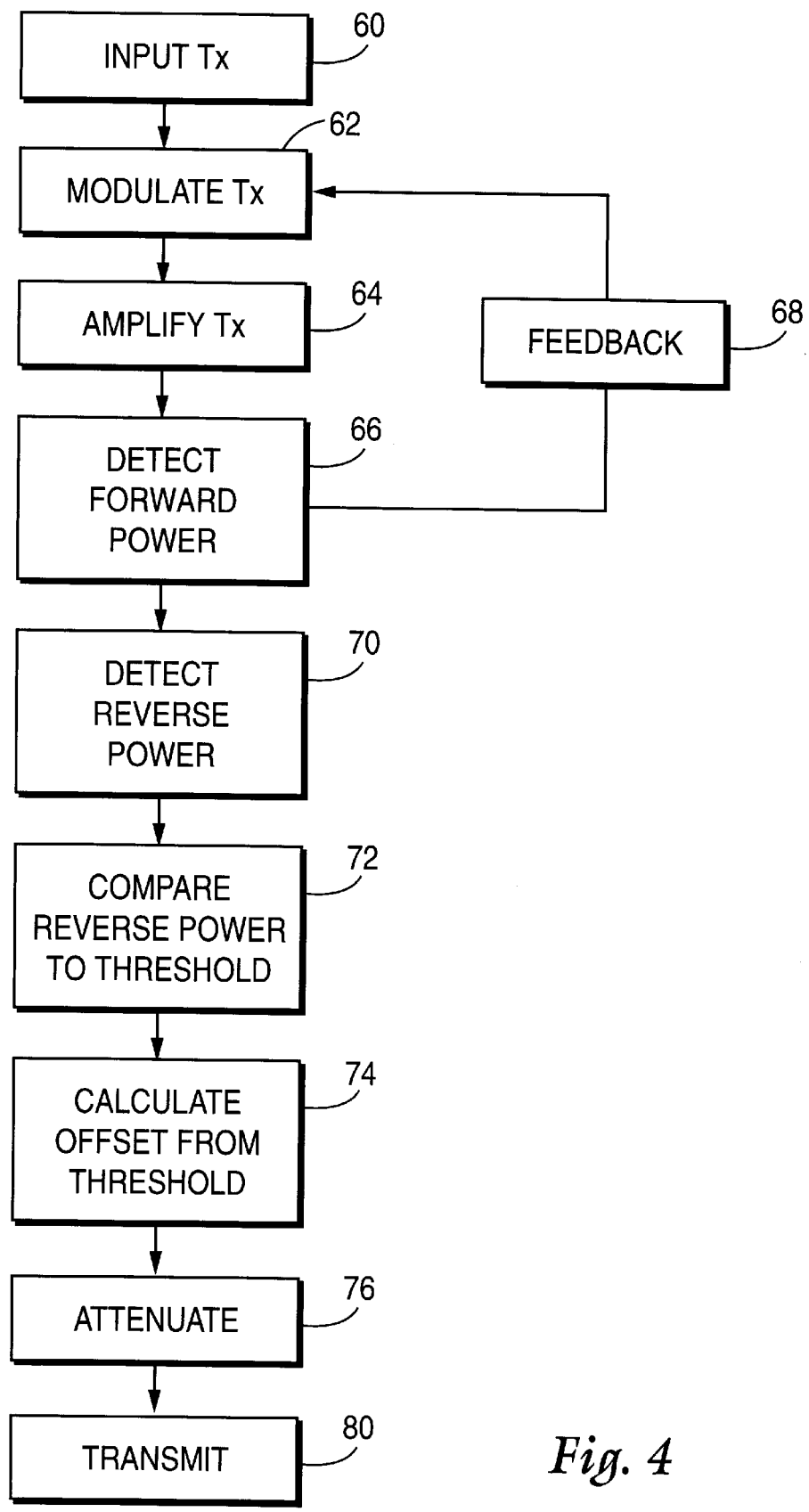
FIG. 4 is a flowchart identifying the steps performed by an example embodiment of the transceiver of FIG. 2.

FIG. 4 illustrates an example embodiment of the steps performed by a method according to the present invention. According to the method of FIG. 4, a transmission input signal is accepted in step 60 and modulated in step 62. The modulated transmission signal is then amplified in step 64, usually by a power amplifier such as power amplifier 24 in FIG. 2.

After the amplified transmission signal is obtained in step 64, the forward power is detected in step 66 and the reverse power is detected in step 70. Meanwhile, the forward power signal detected in step 66 is fed back in step 68 to the modulation step 62, where it is modulated with the incoming input transmission signal at step 60. The reverse power signal detected at step 70 is compared to a threshold at step 72. The offset of the reverse power signal from the threshold is calculated in step 74 and an appropriate attenuation value is calculated in step 76 based on the offset provided in step 74. The appropriate attenuation can be, for example, linearly related to the offset between the reverse power signal and the threshold. The attenuation in step 76 is followed by transmission at step 80.

The present methods and apparatus are simple, provide good output power for a given voltage standing wave ratio, and can be easily implemented. In addition, the components required for the present invention are small and operate in a broad band. As can be seen from the above disclosure, the present techniques relax the constraints on the power amplifier and linearization circuitry and thus provide operational safety when the impedance of the amplifier 12 dramatically changes. The present techniques provide such safety even when an antenna goes bad or is completely removed.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. An RF device, comprising:

a modulator;

an RF power amplifier connected to the modulator;

a directional coupler for detecting a reverse power signal at an output of the power amplifier, the reverse power signal identifying any power reflected into the power amplifier;

a standing wave controller for creating a standing wave control signal from the reverse power signal;

an attenuator for attenuating an output signal from the power amplifier based on the standing wave control signal.

2. An RF device according to claim 1, further including:

a feedback loop connected from the output of the power amplifier to an input of the modulator;

the directional coupler also for detecting a forward power signal at the output of the power amplifier and providing the forward power signal to the feedback loop.

3. An RF device according to claim 2, wherein:

the feedback loop is a Cartesian feedback loop.

4. An RF device according to claim 1, further including:

a terminal characterized by an output impedance;

an antenna connected at the terminal and characterized by an antenna impedance; and wherein the reverse power signal detected by the directional coupler is indicative of any difference between the antenna impedance and the output impedance.

5. An RF device according to claim 1, wherein:

the attenuator maintains the output signal at a level the impedes the modulator from operating in a non-linear manner.

6. An RF device according to claim 1, wherein:

the modulator employs an amplitude variable carrier.

7. A radio transceiver, comprising:

a modulator employing a linear modulation technique to provide a modulated signal;

an RF power amplifier connected to receive the modulated signal and amplify it to an amplified signal;

an attenuator connected to receive the amplified signal and attenuate it in accordance with a standing wave control signal;

a directional coupler connected between the power amplifier and the attenuator to detect a forward power signal and a reverse power signal at an output of the power amplifier;

a standing wave controller connected to receive the reverse power signal and to create therefrom the standing wave control signal; and a feedback loop connected to receive the forward power signal and to provide therefrom a feedback signal to the modulator.

8. A radio transceiver according to claim 7, wherein the modulation technique is phase shift keying.

9. A radio transceiver according to claim 7, wherein the attenuator is a step attenuator.

10. A radio transceiver according to claim 7, wherein the feedback loop is a Cartesian feedback loop.

11. A radio transceiver according to claim 7, wherein:
the modulator employs an amplitude variable carrier.

12. A radio transceiver according to claim 7, wherein:
the attenuator adjusts the output of the power amplifier to a level that the impedes the modulator from operating in a non-linear manner.

13. A method of transmitting an input signal, comprising the steps of:

modulating the input signal using a linear modulation technique;

amplifying the modulated input signal in a RF power amplifier;

detecting a reverse power signal identifying reflected power at an output of the power amplifier;

creating a standing wave control signal based on the reverse power signal;

attenuating the signal obtained in the amplifying step based on the standing wave control signal.

14. A method according to claim 13, further including the step of:

detecting a forward power signal at the output of the power amplifier; and feeding back a feedback signal derived from the forward power signal.

15. A method according to claim 14, wherein the step of feeding back employs a Cartesian feedback technique.

16. A method according to claim 13, wherein the step of detecting includes the step of providing a directional coupler at the output of the power amplifier.

17. A method according to claim 13, further including the step of:

transmitting the attenuated signal using an antenna.

18. A method according to claim 13, wherein the step of attenuating includes the step of maintaining the modulation technique in a linear operating mode.

* * * * *